(12) United States Patent
Shokouhi et al.

(10) Patent No.: US 6,448,823 B1
(45) Date of Patent: Sep. 10, 2002

(54) TUNABLE CIRCUIT FOR DETECTION OF NEGATIVE VOLTAGES

(75) Inventors: Farshid Shokouhi, San Jose; Ben Yau Sheen, Milpitas; Qi Lin, Cupertino, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/452,369

(22) Filed: Nov. 30, 1999

(51) Int. Cl.[7] .................................................. H03K 5/22

(52) U.S. Cl. .............................. 327/68; 327/77; 327/88

(58) Field of Search .............................. 327/50, 63, 68, 327/77, 90, 89, 74, 75, 82, 88, 143, 198, 538, 540

(56) References Cited

U.S. PATENT DOCUMENTS

| | | | | |
|---|---|---|---|---|
| 4,964,082 A | * | 10/1990 | Sato et al. ............. | 365/189.09 |
| 5,191,235 A | * | 3/1993 | Hara ........................... | 327/534 |
| 5,490,110 A | * | 2/1996 | Sawada et al. ........ | 365/185.03 |
| 5,553,295 A | * | 9/1996 | Pantelakis et al. .......... | 395/750 |
| 5,654,663 A | * | 8/1997 | McClure et al. ............ | 327/530 |
| 5,663,907 A | * | 9/1997 | Frayer et al. .......... | 365/185.18 |
| 5,784,319 A | * | 7/1998 | Villa et al. .............. | 365/185.33 |
| 5,818,758 A | * | 10/1998 | Wojciechowski ...... | 365/185.18 |
| 5,872,479 A | * | 2/1999 | Shin ............................ | 327/537 |
| 6,008,674 A | * | 12/1999 | Wada et al. ................... | 327/89 |

* cited by examiner

Primary Examiner—Toan Tran
Assistant Examiner—Hai L. Nguyen
(74) Attorney, Agent, or Firm—Edel M. Young; Scott R. Brown, Esq.

(57) ABSTRACT

The present invention provides a tunable circuit for quickly optimizing an electrical field generated by the F-N tunneling operation. To optimize this electrical field, the charging of the positive charge pump is begun after the charging of the negative charge pump. The tunable circuit of the present invention provides a means to detect the optimal negative voltage at which pumping of the positive voltage should begin. The tunable circuit includes a resistor chain coupled between a first reference voltage and a negative voltage from a negative charge pump. When charging of the negative charge pump begins, a comparator compares the voltage at a node within the resistor chain to a second reference voltage. In accordance with the present invention, the node voltage within the resistor chain is equal to the second reference voltage when the negative voltage is equal to the voltage to be detected. Thus, the comparator generates a trigger signal when the voltage at the node decreases to the second reference voltage. This output signal triggers the pumping of the positive charge pump. By changing the resistance within the resistor chain, the positive charge pumping may be initiated at varying negative voltages. In the present invention, additional resistance is added to or removed from the resistor chain via metal options or switches.

4 Claims, 5 Drawing Sheets

TUNABLE CIRCUIT FOR DETECTION OF NEGATIVE VOLTAGES

FIELD OF THE INVENTION

The present invention relates to an electrically erasable programmable floating gate memory, such as flash memory or electrically erasable programmable read only memory (EEPROM) for both memory and programmable logic application. More specifically, the present invention relates to a method and structure to detect negative voltages to improve programming of a memory cell.

DISCUSSION OF RELATED ART

Many memory cell arrays, such as flash memory cells, use Fowler-Nordheim (F-N) tunneling mechanisms to program and erase the memory cells. F-N tunneling occurs when a large voltage differential exists between the control gate terminal and a source/drain terminal of a memory cell. The large voltage differential establishes an electrical field in the tunnel oxide region of the memory cell. This electrical field promotes the acquisition of electrons by or distribution of electrons from the floating gate of the memory cell, depending on the direction of the voltage differential. When the voltage (e.g., +15 Volts) applied to the control gate terminal is much larger than the voltage (e.g., 0 Volts) applied to the source/drain terminal, electrons are drawn into the floating gate. When the voltage (e.g., 0 Volts) applied to the control gate terminal is much smaller than the voltage (e.g., +15 Volts) applied to the source/drain terminal, electrons are expelled from the floating gate.

Some F-N tunneling schemes use positive and negative voltages to reduce the stress on chip elements. In these cases, the large voltage differential is created by having a positive voltage on one terminal of the memory cell and a negative voltage on another terminal. Thus, to draw electrons into the floating gate, a positive voltage (e.g., +5 Volts) is applied to the control gate terminal of the memory cell and a negative voltage (e.g., −8 Volts) is applied to the source/drain terminal. Also, to remove electrons from the floating gate, a negative voltage (e.g., −8 Volts) is applied to the control gate terminal of the memory cell and a positive voltage (e.g., +5 Volts) is applied to the source/drain terminal.

Both a $V_{CC}$ supply voltage (e.g., 3.3 Volts) and ground (0 Volts) voltages are readily available to any circuit on a chip. A charge pump must be used for voltages greater than the $V_{CC}$ supply voltage or less than ground. Thus, charge pumps are needed to achieve the voltage differential required for an F-N tunneling operation.

A negative charge pump produces a negative supply voltage, $V_{NN}$. The $V_{NN}$ negative supply voltage is the negative voltage used for the F-N tunneling operation. The negative charge pump operates by gradually decreasing (pumping down) the $V_{NN}$ negative supply voltage from an initial voltage of ground to the desired negative voltage.

A positive charge pump produces a positive supply voltage, $V_{PP}$. The $V_{PP}$ positive supply voltage is the positive voltage used for the F-N tunneling operation. The positive charge pump operates by gradually increasing (pumping up) the $V_{PP}$ positive supply voltage from an initial voltage of ground to the desired positive voltage. The requirement of pumping these supply voltages causes a delay before these supply voltages reach their final desired voltages.

In a conventional F-N tunneling operation, the time between the initiation of pumping of the negative charge pump and the initiation of pumping between the positive charge pump may not be optimized. As a result, a high negative voltage applied to the control gate and a high positive voltage applied to the drain or source region to remove electrons from the floating gate may cause an electrical field spike in the tunnel oxide. This electrical field spike can induce "electron trapping" in the tunnel oxide, wherein electrons from the F-N tunneling operation become trapped in the tunnel oxide adjacent to the top surface of the substrate of a memory cell. Electron trapping thus reduces the effectiveness of the F-N tunneling operation by reducing the number of electrons that pass through the tunnel oxide of the memory cell during the F-N operation. Over many repetitions of the F-N operation, increasing numbers of electrons become trapped in the tunnel oxide of the memory cell. The amount of time a memory cell must undergo an F-N tunneling operation increases with the number of electrons trapped in the tunnel oxide of the memory cell. Each memory cell undergoing F-N tunneling in an array is affected by electron trapping. As a result, electron trapping causes an entire memory cell to undergo increasingly longer durations of F-N tunneling operations over time. Therefore, a need arises for a way to minimize fluctuations in the electrical field during programming of the memory cells.

SUMMARY OF THE INVENTION

The present invention provides a tunable circuit for optimizing an electrical field generated by the F-N tunneling operation.

To optimize the electrical field, the charging of the positive charge pump is begun after the charging of the negative charge pump. The tunable circuit of the present invention provides a means to detect the optimal negative voltage at which pumping of the positive voltage should begin. The tunable circuit includes a resistor chain coupled between a first reference voltage and a negative voltage from a negative charge pump. A node within the resistor chain is compared to a second reference voltage using a comparator. In this way, the node within the resistor chain is equal to the second reference voltage when the negative voltage is equal to the voltage to be detected.

The output signal of the comparator changes state when the voltage at the node within the resistor chain decreases below the second reference voltage. This output signal triggers the charging of a positive charge pump. Additional resistance is added to or removed from the resistor chain via metal options or switches. By changing the resistance within the resistor chain, the positive charge pumping may be initiated at varying negative voltages.

Thus, the tunable circuit of the present invention provides a way to trip the charging of a positive charge pump based on a given voltage level of a negative charge pump during an F-N tunneling operation, thereby maintaining a constant electrical field during programming of the memory cells.

DETAILED DESCRIPTION OF THE INVENTION

Recent studies indicate that the electrical field formed by an F-N tunneling operation has a more constant value throughout the operation if pumping of the positive voltage (or alternately the negative voltage) is initiated after the pumping of the negative voltage (or alternately the positive voltage) has begun. A more constant value of this electrical field has been shown to significantly reduce the incidence of electron trapping in memory cells undergoing the F-N tunneling operation. Additional, time-consuming testing is required to determine the optimal negative voltage at which the pumping of the positive voltage should begin. Specifically, to determine this optimal negative voltage, many negative voltages are detected, and the constancy of each associated electrical field sampled.

The present invention provides a tunable negative voltage detector used to efficiently detect the negative voltage at which charging of the positive charge pump begins, thereby quickly optimizing the electrical field. Determining the optimal negative voltage for the most constant electrical field involves two steps. The first step is achieving some portion of the negative voltage required for the F-N tunneling operation (i.e., the trip voltage). The second step is initiating the pumping of the positive voltage required for the F-N tunneling operation when the negative voltage passes through the trip voltage. During these two steps, the constancy of the electrical field formed is measured. These two steps are repeated until the most constant electrical field is formed. The optimal negative voltage is then the negative voltage associated with the most constant electrical field.

Figure 1:
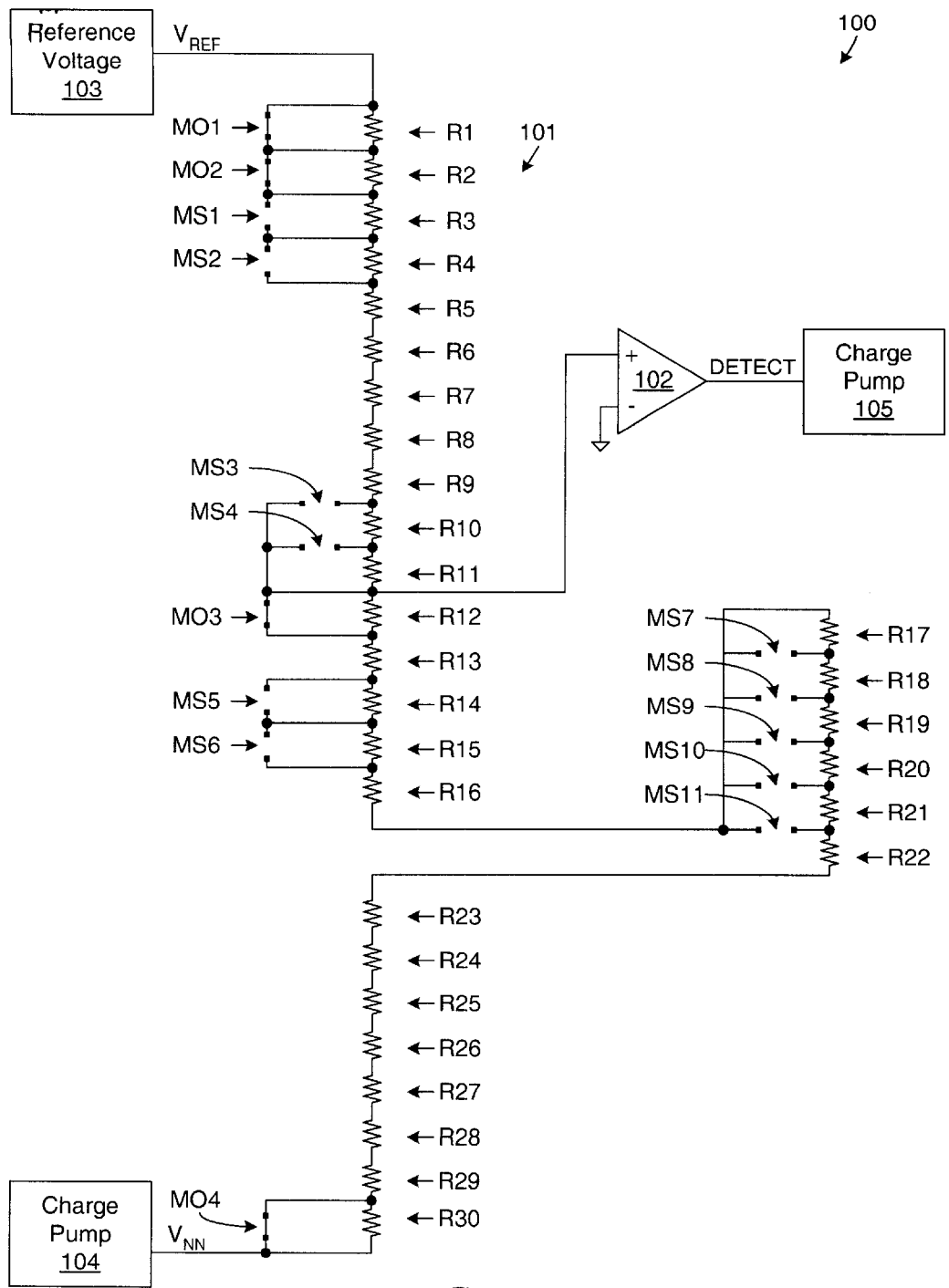
FIG. 1 is a schematic diagram of a negative voltage detector in accordance with an embodiment of the present invention.

FIG. 1 illustrates a tunable negative voltage detector 100 in accordance with the present invention coupled between a negative charge pump 104 and a positive charge pump 105. Negative voltage detector 100 includes a resistor chain 101 and a comparator 102. Resistor chain 101 includes resistors R1–R30 coupled in series between a reference voltage generator 103 and negative charge pump 104. In one embodiment, resistors R1–R30 are p-well resistors with resistors R1–R3 having a resistance value of 2500 Ohms, resistors R4–R5 and R14–R15 having a resistance value of 10,000 Ohms, and resistors R6–R13 and R16–R30 having a resistance value of 25,000 Ohms. Reference voltage generator 103, negative charge pump 104, and positive charge pump 105 are well known in the art, and are therefore not described in detail.

Reference voltage generator 103 provides a first reference voltage, VREF, to resistor chain 101. In one embodiment, reference voltage generator 103 is a band gap generator coupled with an amplifier and provides a $V_{REF}$ reference voltage of 2.1 Volts. Negative charge pump 104 provides a negative supply voltage, $V_{NN}$, to resistor chain 101. Negative charge pump 104 pumps down the $V_{NN}$ negative supply voltage from an initial voltage (e.g., 0 Volts) to a final voltage (e.g., –8 Volts). The value of the final voltage of the $V_{NN}$ negative supply voltage is the negative voltage required by the F-N tunneling operation. Positive charge pump 105 pumps up the $V_{PP}$ positive supply voltage from an initial voltage (e.g., 0 Volts) to a final voltage (e.g., 8 Volts). The value of the final voltage of the $V_{PP}$ positive supply voltage is the positive voltage required by the F-N tunneling operation.

The non-inverting terminal of comparator 102 is coupled to receive the voltage present between resistors R11–R12. The inverting terminal of comparator 102 is coupled to ground. Comparator 102 is coupled to provide the DETECT signal to positive charge pump 105.

Metal open options MO1–MO4 and metal short options MS1-MS11 selectively tune negative voltage detector 100. A metal open option is a wire that may be cut to open a path. For example, in the circuit of FIG. 1, if resistor R1 is shorted by metal open option MO1, resistor R1 does not contribute to the negative voltage detection. However, if metal open option MO1 is cut, then resistor R1 does contribute to the negative voltage detection.

A metal short option is a junction that may be wired closed to short a path. For example, in the circuit of FIG. 1, resistor R3 contributes to the negative voltage detection. However, if metal short option MS1 is wired closed, then resistor R3 is shorted and therefore does not contribute to the detection of the negative voltage. Those skilled in the art will recognize other embodiments of the present invention, such as locating the metal open and metal short options in other locations along resistor chain 101.

Negative voltage detector 100 operates as follows. The resistance value of each resistor R1–R30 and the $V_{REF}$ reference voltage (e.g., 2.1 Volts) are known. The $V_{NN}$ negative supply voltage is initially equal to a voltage of 0 Volts. At this point, all nodes between resistors R11–R12 must be positive because the nodes are located between the $V_{REF}$ positive reference voltage and ground. Thus, the node between resistors R11–R12 is positive. As a result, the voltage provided to the non-inverting terminal of comparator 102 is more positive than the voltage of ground provided to the inverting terminal of comparator 102. Therefore, comparator 102 initially provides a logic low DETECT signal to positive charge pump 105. This logic low value of the DETECT signal prevents positive charge pump 105 from pumping.

As the voltage of the $V_{NN}$ negative supply voltage is pumped down, the voltage at each node of resistor chain 101 lessens. When the $V_{NN}$ supply voltage reaches a given trip voltage, $V_{TRIP}$, the voltage at the node between resistors R11–R12 has decreased to a voltage of 0 Volts. At this time (i.e., time $T_{TRIP}$) the DETECT signal provided by comparator 102 transitions to a logic high value. This logic high value of the DETECT signal triggers positive charge pump 105 to initiate the pumping up of the $V_{PP}$ positive supply voltage.

Thus, the present invention causes the positive charge pump to pump up the $V_{PP}$ positive supply voltage only after the negative charge pump pumps down the $V_{NN}$ negative supply voltage to a predetermined level. In this manner, the present invention significantly reduces electron trapping during an F-N operation by keeping a constant electrical field throughout the programming of the memory cells. As described above, this constant electrical field is achieved by pumping up the positive charge pump only after the negative charge pump pumps down the $V_{NN}$ negative supply voltage to a predetermined level.

Figure 2:
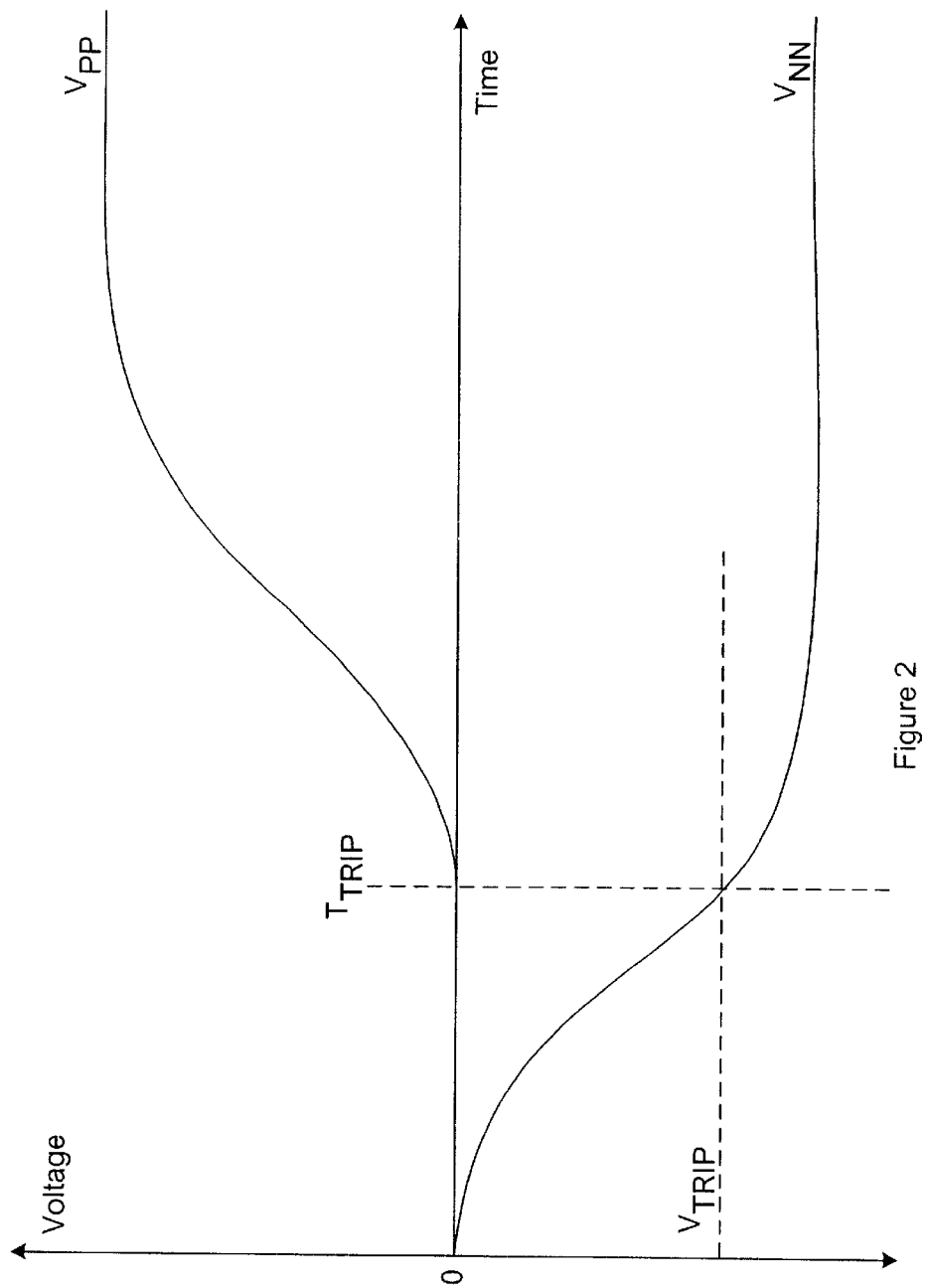
FIG. 2 is a plot of voltage over time for two charge pump voltages in accordance with an embodiment of the present invention.

FIG. 2 is a plot of voltage over time for two signals, the $V_{NN}$ negative supply voltage and the $V_{PP}$ positive supply voltage. Initially, negative charge pump 104 (FIG. 1) provides a $V_{NN}$ negative supply voltage equal to 0 Volts. The $V_{NN}$ supply voltage gradually decreases to a steady negative state (e.g., –8.0 Volts). In accordance with the present invention, the charge pumping of the $V_{PP}$ positive supply voltage begins only after the $V_{NN}$ negative supply voltage has reached a certain trip voltage, $V_{TRIP}$, as described above. The $V_{NN}$ negative supply voltage reaches a voltage of $V_{TRIP}$ at time $T_{TRIP}$. Thus, at time $T_{TRIP}$, positive charge pump 105 starts pumping up the $V_{PP}$ positive supply voltage. The $V_{PP}$ positive supply voltage has an initial voltage of 0 Volts and gradually increases to a steady positive state (e.g., +8.0 Volts).

Figure 3:
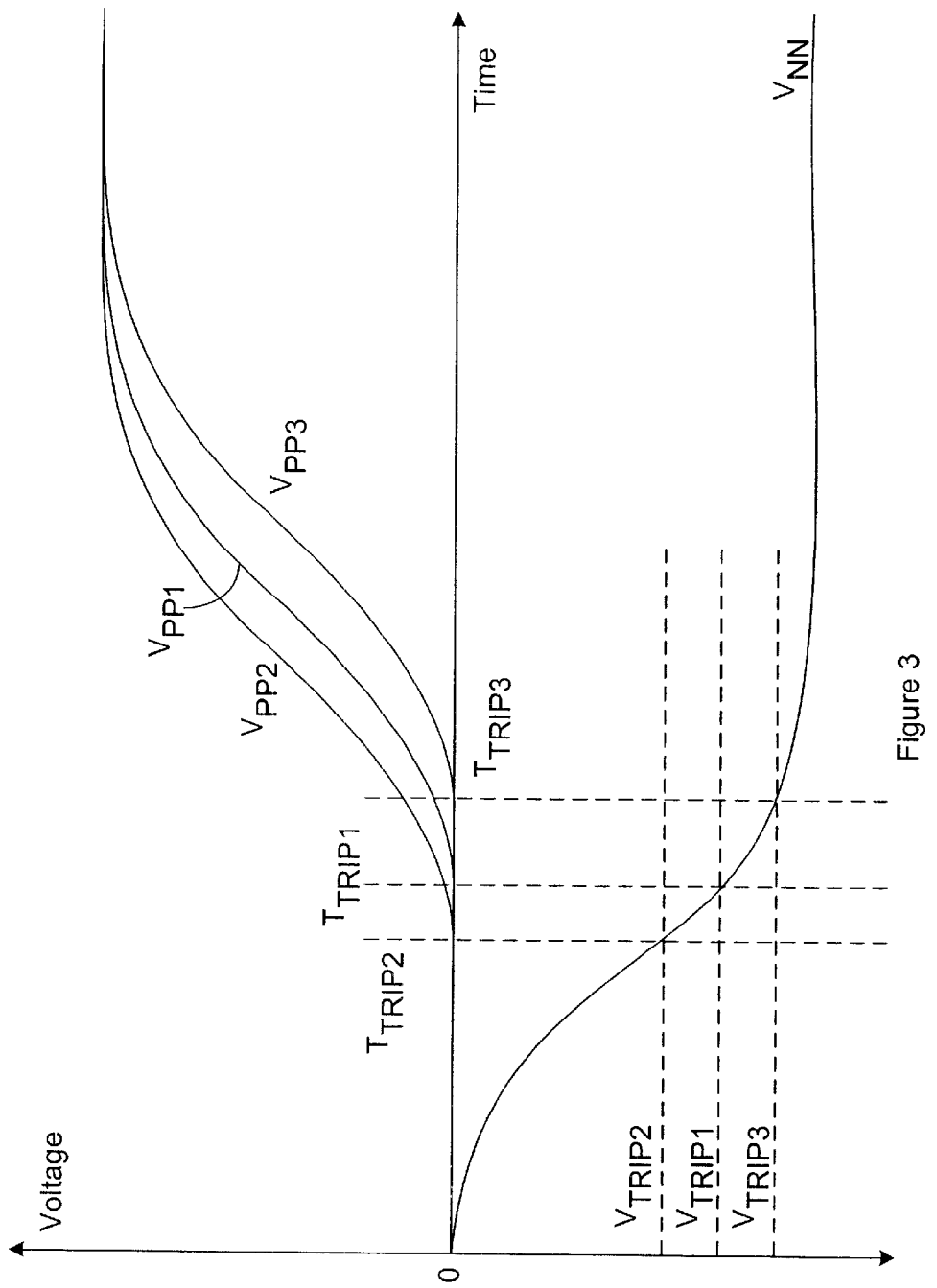
FIG. 3 is a plot of voltage over time for a family of charge pump voltages in accordance with an embodiment of the present invention.

FIG. 3 is a plot of voltage over time for a family of $V_{PP}$ positive supply voltage curves for three different $V_{TRIP}$ trip voltages. The $V_{PP1}$–$V_{PP3}$ positive voltage supplies represent the $V_{PP}$ positive supply voltage as a function of the trip voltages $V_{TRIP1}$–$V_{TRIP3}$. Specifically, $V_{PP1}$ begins pumping up at time $T_{TRIP1}$ when resistor chain 100 is set to detect the $V_{TRIP1}$ trip voltage, $V_{PP2}$ begins pumping up at time $T_{TRIP2}$ when resistor chain 100 is set to detect the $V_{TRIP2}$ trip voltage, and $V_{PP3}$ begins pumping up at time $T_{TRIP3}$ when resistor chain 100 is set to detect the $V_{TRIP3}$ trip voltage.

The present invention facilitates the quick analysis of any number of trip voltages, thereby allowing the optimal trip voltage to be determined. Thus, the tunable nature of negative voltage detector 100 allows the initiation of positive charge pumping of the $V_{PP}$ positive supply voltage at many different times. For example, assume resistor chain 100 as shown in FIG. 1 detects the $V_{TRIP1}$ voltage at time $T_{TRIP1}$. If it is desired to initiate the pumping up of the $V_{PP}$ positive supply voltage at an earlier time, $T_{TRIP2}$, then the trip voltage of the $V_{NN}$ negative supply voltage detected by the present invention must be increased to a less negative voltage, $V_{TRIP2}$. To detect the $V_{TRIP2}$ voltage with resistor chain 100 (FIG. 1), additional resistors are added into the resistor chain above the node between resistors R11–R12. Metal open options MO1–MO2, which short resistors R1–R2, respectively, are cut to provide the additional resistance. As a result of cutting metal open options MO1–MO2, the trip voltage increases to a less negative voltage, $V_{TRIP2}$, thereby initiating the pumping positive charge pump 105 at an earlier time, $T_{TRIP2}$. The result is shown as the $V_{PP2}$ positive supply voltage. Note that removing resistors below the node between resistors R11–R12 also detects a less negative trip voltage than $V_{TRIP1}$.

If it is desired to initiate the pumping up the $V_{PP}$ positive supply voltage at a later time, $T_{TRIP3}$, the trip voltage of the $V_{NN}$ negative supply voltage detected by the present invention must be decreased to a more negative voltage, $V_{TRIP3}$. To detect the $V_{TRIP3}$ voltage from resistor chain 100 (FIG. 1), resistors are removed from the resistor chain above the node between resistors R11–R12. Metal short options MS7–MS9 are wired closed to short resistors R17–R19, respectively. As a result, the trip voltage of the $V_{NN}$ negative supply voltage detected by the present invention decreases to a more negative voltage, $V_{TRIP3}$. Therefore, the positive charge pump begins pumping up the $V_{PP}$ positive supply voltage at a later time, $T_{TRIP3}$. The result is shown as the $V_{PP3}$ positive supply voltage. Note that removing resistors above the node between resistors R11–R12 also detects a more negative voltage than $V_{TRIP1}$.

The present invention advantageously detects different trip points of the $V_{NN}$ negative supply voltage. As a result, the trip point which optimizes the electrical field during an F-N tunneling operation is quickly ascertained.

Figure 4:
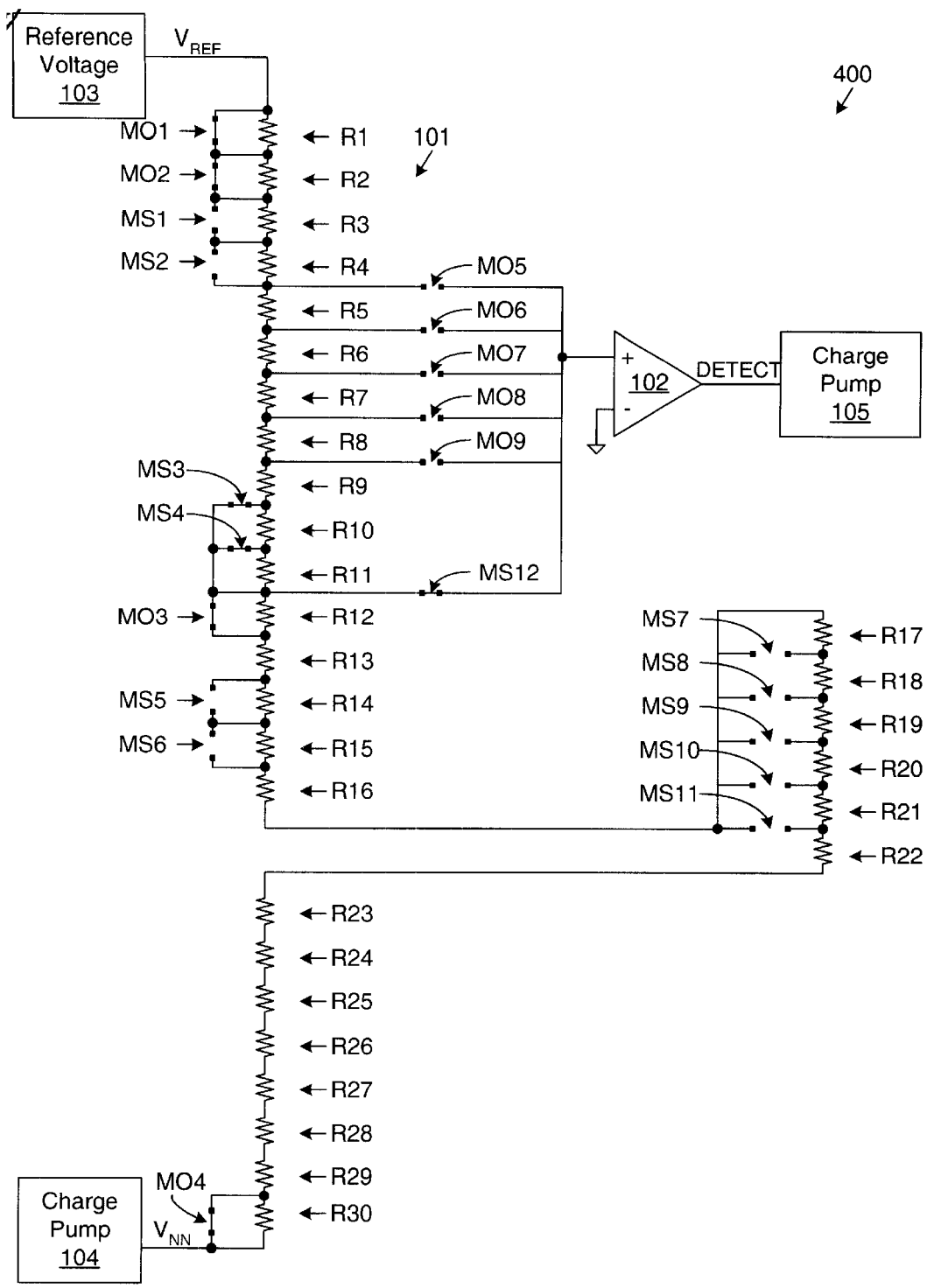
FIG. 4 is a schematic diagram of a negative voltage detector in accordance with another embodiment of the present invention.

FIG. 4 illustrates a tunable negative voltage detector 400 in accordance with another embodiment of the present invention. Similar elements in FIGS. 1 and 4 are labeled similarly. Thus, negative voltage detector 400 is coupled between a negative charge pump 104 and a positive charge pump 105. Negative voltage detector 400 includes a resistor chain 101 and a comparator 102.

Negative voltage detector 400 includes all of the functionality described with respect to negative voltage detector 100 (FIG. 1). The addition of metal open options MO5–MO9 and metal short option MS12 beneficially provide an additional way to change the voltage detected by negative voltage detector 400.

Figure 5:
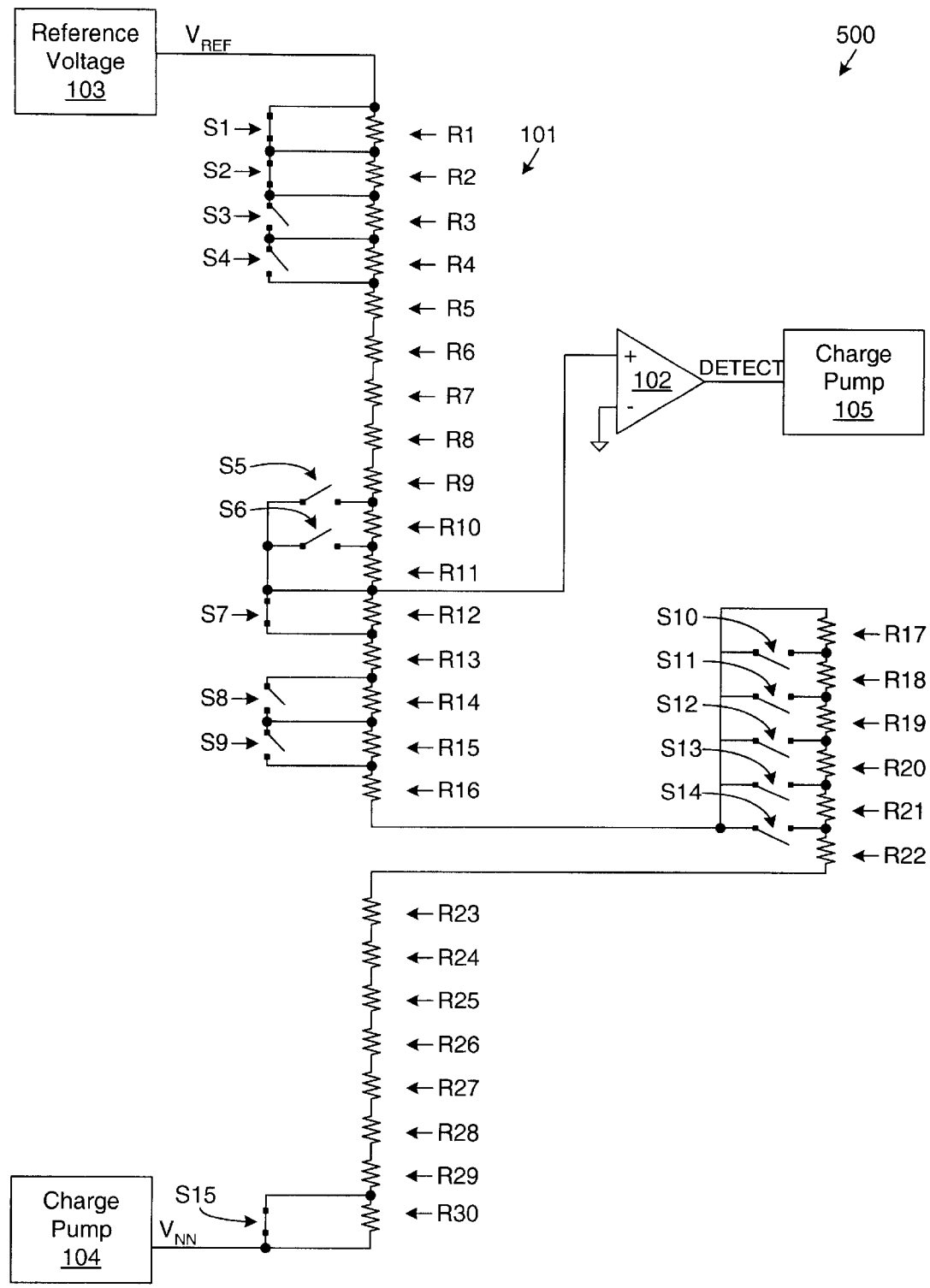
FIG. 5 is a schematic diagram of a negative voltage detector in accordance with another embodiment of the present invention.

FIG. 5 illustrates a tunable negative voltage detector 500 in accordance with another embodiment of the present invention. Similar elements in FIGS. 1 and 5 are labeled similarly. Thus, negative voltage detector 500 is coupled between a negative charge pump 104 and a positive charge pump 105. Negative voltage detector 500 includes a resistor chain 101 and a comparator 102.

Negative voltage detector 500 includes all of the functionality described with respect to negative voltage detector 100 (FIG. 1). The addition of metal switches S1–S15 beneficially provide an additional way to change the voltage detected by negative voltage detector 500.

Although the present invention has been described in connection with one embodiment, it is understood that this invention is not limited to such embodiment, but is capable of various modifications which would be apparent to a person skilled in the art. For example, metal switches may be used in place of metal open options and metal short options in resistor chain 100. Thus, the invention is limited only by the following claims.

We claim:

1. A tunable voltage detector for detecting a predetermined negative voltage provided by a negative charge pump, the tunable detector comprising:

a plurality of resistors coupled in series between a first reference voltage and the negative charge pump;

a plurality of metal open options, each metal open option coupled to one of the plurality of resistors;

a plurality of metal short options, each metal short option coupled to one of the plurality of resistors; and a voltage comparator having a first input terminal coupled to one of the plurality of resistors and a second input terminal coupled to a second reference voltage.

2. The tunable voltage detector of claim 1, wherein a signal provided by the voltage comparator controls a positive charge pump.

3. A tunable voltage detector for detecting a predetermined negative voltage provided by a negative charge pump, the tunable voltage detector comprising:

a plurality of resistors coupled between a first reference voltage and the negative charge pump;

a plurality of switches, each switch coupled to one of the plurality of resistors; and a voltage comparator having a first input terminal coupled to one of the plurality of resistors and a second input terminal coupled to a second reference voltage.

4. The tunable voltage detector of claim 3, wherein a signal provided by the voltage comparator controls a positive charge pump.

* * * * *